(12) United States Patent
Yu

(10) Patent No.: US 10,045,458 B2
(45) Date of Patent: Aug. 7, 2018

(54) CHASSIS STRUCTURE

(71) Applicant: Wei-Cheng Yu, Taipei (TW)

(72) Inventor: Wei-Cheng Yu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/604,681

(22) Filed: May 25, 2017

(65) Prior Publication Data

US 2017/0347472 A1  Nov. 30, 2017

Related U.S. Application Data

(60) Provisional application No. 62/343,124, filed on May 30, 2016.

(51) Int. Cl.
*G06F 1/18* (2006.01)
*H05K 7/14* (2006.01)
*H05K 5/02* (2006.01)
*G11B 33/12* (2006.01)

(52) U.S. Cl.
CPC ........... *H05K 7/1489* (2013.01); *G06F 1/181* (2013.01); *G11B 33/128* (2013.01); *H05K 5/023* (2013.01); *H05K 7/142* (2013.01); *H05K 7/1415* (2013.01); *H05K 7/1487* (2013.01); *H05K 7/1409* (2013.01); *H05K 7/1457* (2013.01)

(58) Field of Classification Search
CPC ................................. G06F 1/181; G06F 1/187
See application file for complete search history.

(56) References Cited

U.S. PATENT DOCUMENTS

| | | | | |
|---|---|---|---|---|
| 6,025,989 A | * | 2/2000 | Ayd | G06F 1/183 312/236 |
| 6,580,603 B1 | * | 6/2003 | Resnick | G06F 1/184 312/223.1 |
| 7,394,660 B2 | * | 7/2008 | Hidaka | G11B 33/126 361/724 |
| 9,781,857 B2 | * | 10/2017 | Jau | H05K 7/1487 |
| 2004/0184243 A1 | * | 9/2004 | Mease | G06F 1/184 361/725 |
| 2007/0053155 A1 | * | 3/2007 | Lai | G06F 1/181 361/679.02 |

FOREIGN PATENT DOCUMENTS

| | | |
|---|---|---|
| CN | 203941490 | 11/2014 |
| TW | M278998 | 10/2005 |
| TW | M522544 | 5/2016 |

\* cited by examiner

*Primary Examiner* — Adrian S Wilson
(74) *Attorney, Agent, or Firm* — JCIPRNET

(57) ABSTRACT

A chassis structure includes a chassis body and at least one holder module. The holder module includes a frame and a guiding assembly. The frame is located in the chassis body and has a first linking portion and a second linking portion. The guiding assembly is disposed on the chassis body and has a first guiding slot and a second guiding slot. The second guiding slot has a first segment and a second segment. The first guiding slot and the first segment extend along a straight direction, and the second segment extends along an arched direction. The first linking portion and the second linking portion are adapted to move along the first guiding slot and the first segment respectively at the same time such that the frame moves upward, and then the second linking portion is adapted to move along the second segment such that the frame rotates.

12 Claims, 5 Drawing Sheets

CHASSIS STRUCTURE

CROSS-REFERENCE TO RELATED APPLICATION

This application claims the priority benefit of U.S. provisional application Ser. No. 62/343,124, filed on May 30, 2016. The entirety of the above-mentioned patent application is hereby incorporated by reference herein and made a part of this specification.

BACKGROUND OF THE INVENTION

1. Field of the Invention

The invention relates to a chassis structure. More particularly, the invention relates to a chassis structure in which an electronic module is able to be moved upward and rotate.

2. Description of Related Art

A server is a core computer used to serve computers or portable electronic devices in the network system. The server provides network users with functions such as disks required and printing services. Moreover, clients may share various resources in the network environment through the server. A plurality of hard disk modules are required to be disposed in the server in order to store large amount of data. As the hard disk modules are arranged in sequence and are adjacent to one another, a plurality of sliding tracks are required to be disposed for the adjacent hard disk modules to be able to slide relatively to create spacing, so that the hard disks may be maintained through end surfaces of the hard disk modules. Nevertheless, costs of installing the sliding tracks are relatively high, and much allocation space in the server is also occupied by the sliding tracks.

SUMMARY OF THE INVENTION

The invention provides a chassis structure which requires relatively low installation costs and is able to save arrangement space.

A chassis structure provided by the embodiments of the invention includes a chassis body and at least one holder module. The at least one holder module includes a frame and a guiding assembly. The frame is located in the chassis body and has a first linking portion and a second linking portion. The frame is adapted to carry an electronic module. The guiding assembly is disposed on the chassis body and has a first guiding slot and a second guiding slot. The second guiding slot has a first segment and a second segment. The first guiding slot and the first segment extend along a straight direction. The second segment extends along an arched direction. The first linking portion is slidably disposed in the first guiding slot, and the second linking portion is slidably disposed in the second guiding slot. The first linking portion and the second linking portion are adapted to move along the first guiding slot and the first segment respectively at the same time such that the frame moves upward from a first position to a second position, and then the second linking portion is adapted to move along the second segment such that the frame rotates to a third position using the first linking portion as a rotation axis.

In an embodiment of the invention, the first guiding slot has a first bottom end and a first top end opposite to each other, and the second guiding slot has a second bottom end and a second top end opposite to each other. A moving range of the first linking portion is limited between the first bottom end and the first top end, and a moving range of the second linking portion is limited between the second bottom end and the second top end.

In an embodiment of the invention, the first bottom end is aligned to the second bottom end, and the first top end is aligned to a juncture between the first segment and the second segment.

In an embodiment of the invention, when the frame is located at the first position, the first linking portion and the second linking portion are respectively located at the first bottom end and the second bottom end.

In an embodiment of the invention, when the frame is located at the second position, the first linking portion and the second linking portion are respectively located at the first top end and the juncture between the first segment and the second segment.

In an embodiment of the invention, when the frame is located at the first position, the first linking portion and the second linking portion are respectively located at the first bottom end and the second bottom end.

In an embodiment of the invention, a center of curvature of the second segment is located at the first top end.

In an embodiment of the invention, the chassis body has a bottom surface, and an extending direction of the first guiding slot and the first segment is perpendicular to the bottom surface.

In an embodiment of the invention, the at least one holder module includes a handle. The handle is pivoted to the chassis body and is connected to the frame. The handle is adapted to rotate relative to the chassis body to drive the frame to move to the first position, the second position, and the third position.

In an embodiment of the invention, the handle has a slot. The frame has a connecting portion, and the connecting portion is slidably disposed in the slot.

In an embodiment of the invention, the guiding assembly includes a first rack body and a second rack body. The first rack body and the second rack body are fixed to the chassis body. The first guiding slot is formed on the first rack body, and the second guiding slot is formed on the second rack body.

In an embodiment of the invention, the chassis structure is suitable for a server, and the electronic module is a hard disk module.

Based on the above, in the chassis structure of the invention, the guiding assembly guides the frame to move upward and rotate relative to the chassis body by the first guiding slot and the second guiding slot thereof. As such, the end surface of the electronic module carried by the frame may be moved upward and rotate, and then the end surface is not blocked by the adjacent electronic module, so that a user may maintain the electronic module through the end surface conveniently. Accordingly, unlike conventional design, plural sliding tracks for adjacent electronic modules to be able to slide relatively and to be maintained conveniently are not required to be disposed, such that costs of installing the chassis structure may be reduced and arrangement space of the chassis structure may be saved.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
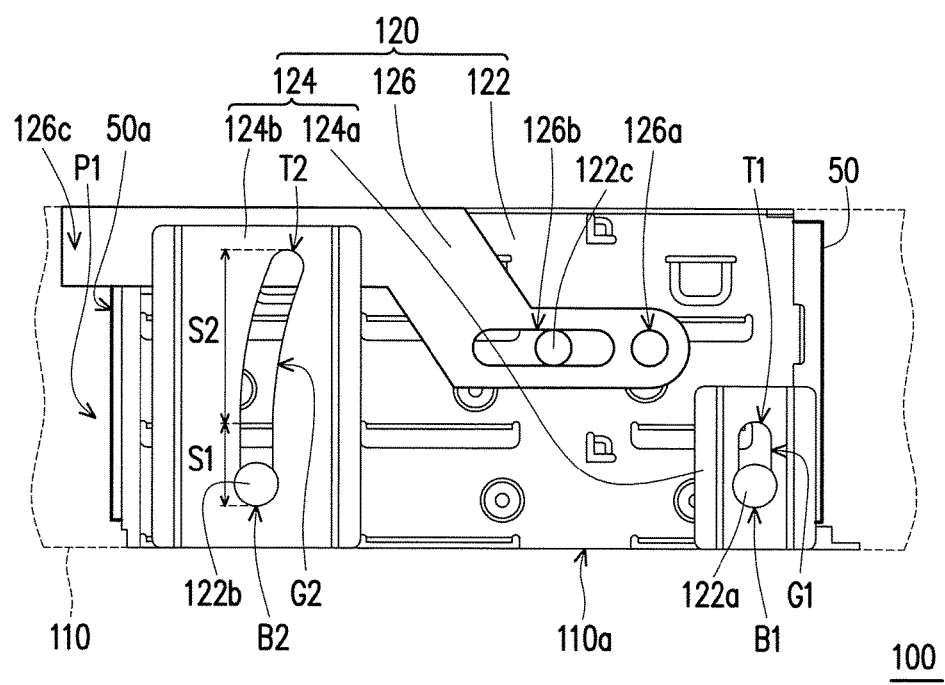
FIG. 1 is a partial side view of a chassis structure according to an embodiment of the invention.

FIG. 1 is a partial side view of a chassis structure according to an embodiment of the invention. Referring to FIG. 1, a chassis structure 100 of the embodiment includes a chassis body 110 and at least one holder module 120 (one is illustrated). The holder module 120 includes a frame 122 and a guiding assembly 124. The frame 122 is located in the chassis body 110 and is configured to carry an electronic module 50. The frame 122 has a first linking portion 122a and a second linking portion 122b. The first linking portion 122a and the second linking portion 122b are configured to connect to the guiding assembly 124.

Specifically, the guiding assembly 124 is disposed in the chassis body 110 and has a first guiding slot G1 and a second guiding slot G2. The second guiding slot G2 has a first segment S1 and a second segment S2. The first guiding slot G1 and the first segment S1 extend along a straight direction (illustrated as a vertical direction), and the second segment S2 extends along an arched direction. The first linking portion 122a is, for example, shaped as a column and is slidably disposed in the first guiding slot G1, and the second linking portion 122b is, for example, shaped as a column and is slidably disposed in the second guiding slot G2. In the embodiment, an extending direction of the first guiding slot G1 and the first segment S1 is, for example, perpendicular to a bottom surface 110a of the chassis body 110, but the invention is not limited thereto. In order to have a clear figure, the chassis body 110 is illustrated in a perspective manner, wherein the holder module 120 and the electronic module 50 are in reality blocked by the chassis body 110 when looking from the view angle of FIG. 1.

Figure 2A:
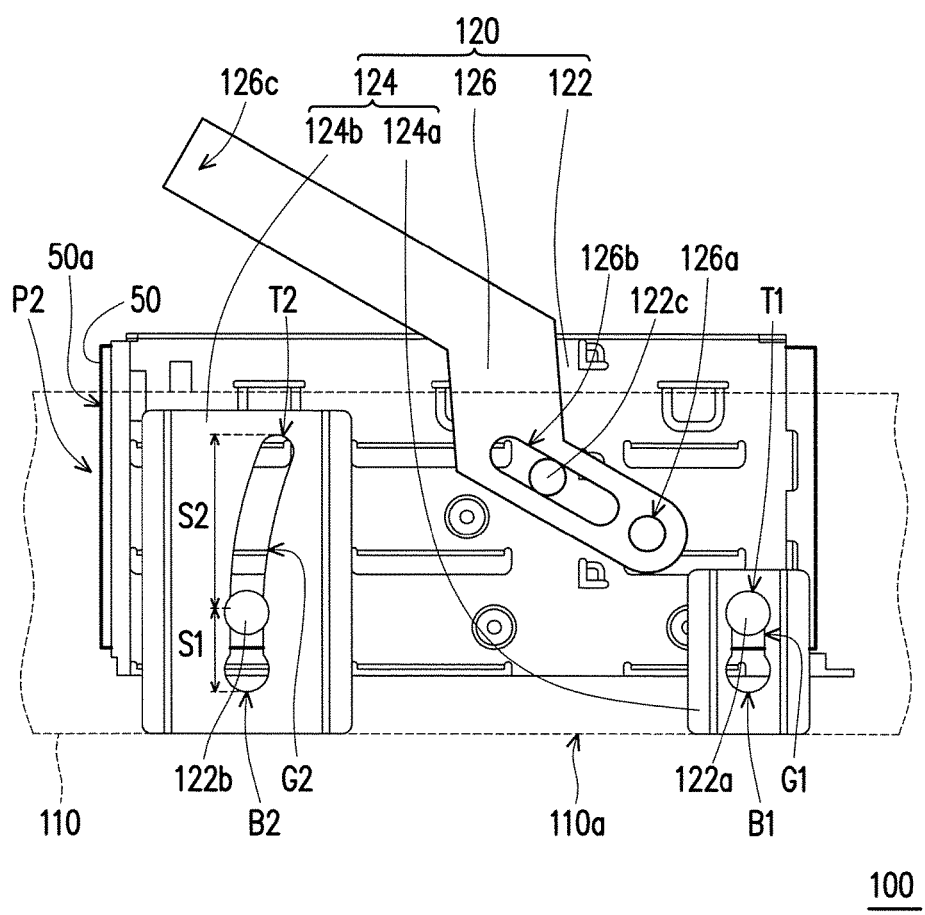
FIG. 2A and FIG. 2B illustrate operation process of the holder module in FIG. 1.
Figure 2B:
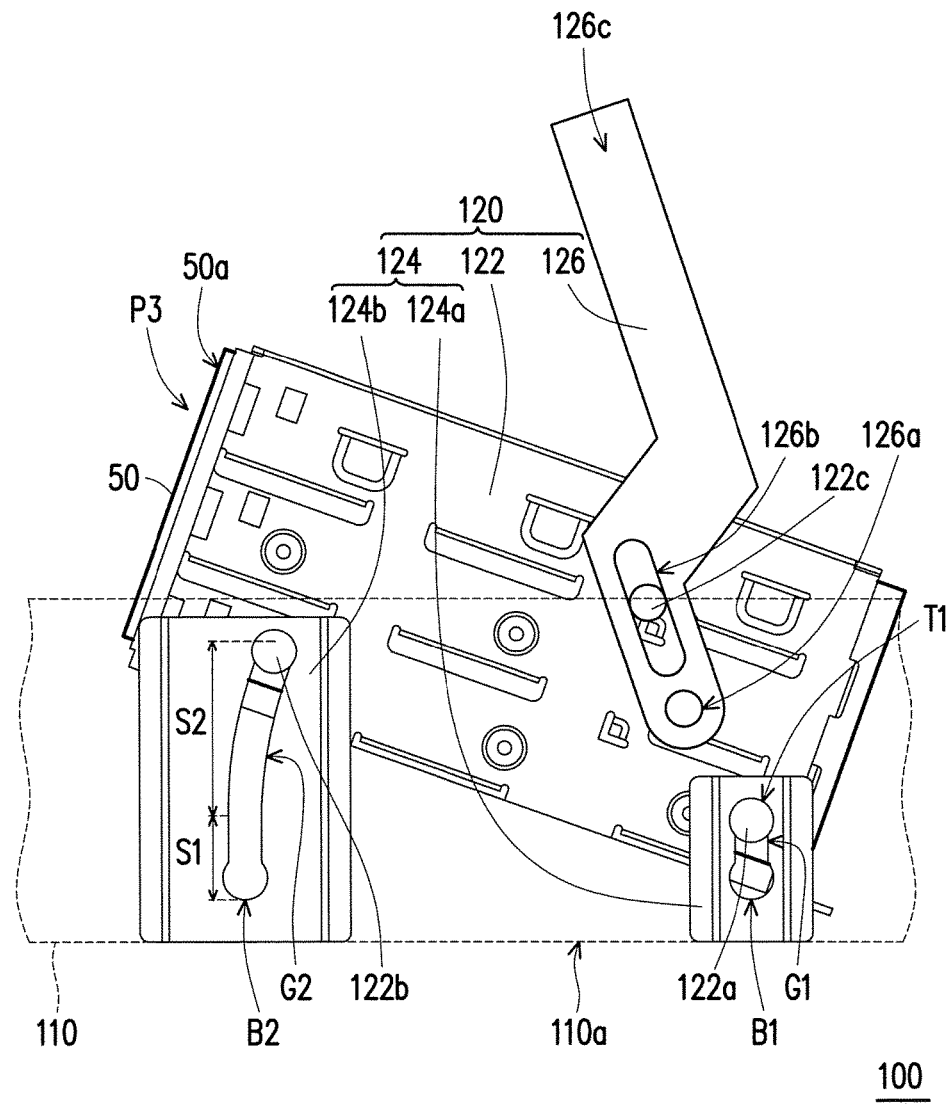

FIG. 2A and FIG. 2B illustrate operation process of the holder module in FIG. 1. When force is applied to the frame 122 by a user, the first linking portion 122a and the second linking portion 122b move vertically upward along the first guiding slot G1 and the first segment S1 respectively at the same time, such that the frame 122 moves upward from a first position P1 illustrated in FIG. 1 to a second position P2 illustrated in FIG. 2A. Next, when force is applied by the user continuously to the frame 122, the first linking portion 122a which has reached an end of the first guiding slot G1 stops moving upward, and the second linking portion 122b moves along the second segment S2, such that the frame 122 rotates to a third position P3 illustrated in FIG. 2B by taking the first linking portion 122a as a rotation axis.

According to such arrangement and operation, the guiding assembly 124 guides the frame 122 to move upward and rotate relative to the chassis body 110 by the first guiding slot G1 and the second guiding slot G2 thereof. As such, an end surface 50a of the electronic module 50 carried by the frame 122 may be moved upward and rotate, so that the user may maintain the electronic module 50 through the end surface 50a conveniently. Accordingly, unlike conventional design, sliding tracks for electronic modules to be able to slide and to be conveniently maintained are not required to be disposed, such that costs of installing the chassis structure 100 may be reduced and arrangement space of the chassis structure 100 may be saved.

As described above, the holder module 120 of the embodiment guides the frame 122 to move upward to the second position P2 from the first position P1 illustrated in FIG. 1 first, and then guides the frame 122 to rotate to the third position P3 from the second position P2 illustrated in FIG. 2A, such that the frame 122 does not begin to rotate at the first position P1. Thereby, a bottom end of the frame 122 is prevented from being interfered with the chassis body 110 when the frame 122 rotates, and a relatively small rotation angle is needed for the frame 122 to enable the end surface 50a of the electronic module 50 to arrive at a position (i.e., the third position P3) at which the electronic module 50 may be maintained conveniently.

In the embodiment, the chassis structure 100 is, for example, a chassis of a server, and the electronic module 50 accommodated in the chassis structure 100 is, for example, a hard disk module of the server. The hard disk drive in the electronic module 50 may be maintained by the user at the end surface 50a of the electronic module 50. In other embodiments, the chassis structure 100 may be applied to other suitable types of devices, the electronic module 50 may be other suitable types of components, and the invention is not limited thereto. In addition, in the embodiment, a rising height of the frame 122 operated from FIG. 1 to FIG. 2A is, for example, 15 mm, and a rotation angle of the frame 122 operated from FIG. 2A to FIG. 2B is, for example, 25 degrees. But the invention is not limited thereto.

The holder module 120 of the embodiment may further include a handle 126. The handle 126 is pivoted to the chassis body 110 through a pivotal end 126a thereof, and the handle 126 is connected to the frame 122 through a slot 126b thereof. The handle 126 may be pulled or pushed by the user, and force is thus applied to the frame 122 through the handle 126 to drive the frame 122 to move as illustrated in FIG. 1, FIG. 2A, and FIG. 2B, for achieving effects of effort-saving and convenient operation. During above operation, the handle 126 rotates relative to the chassis body 122 by taking the pivotal end 126a as the rotation axis to drive the frame 122 to move to the first position P1, the second position P2, and the third position P3.

Specifically, the frame 122 has a connecting portion 122c, and the connecting portion 122c is, for example, a column and is slidably disposed in the slot 126b of the handle 126. During the operation illustrated in FIG. 1, FIG. 2A, and FIG. 2B, the connecting portion 122c moves in the slot 126b when the handle 126 rotates, such that the frame 122 is operated smoothly. In other embodiments, the frame 122 and the handle 126 may be connected to each other through other suitable structures, and the invention is not limited thereto. In addition, force is applied by the user on, for example, an force-applying end 126c of the handle 126, and a distance between the force-applying end 126c and the pivotal end 126a is greater than a distance between the slot 126b and the pivotal end 126a as illustrated, such that effort-saving effect is achieved through the greater arm of force between the force-applying end 126c and the pivotal end 126a.

The guiding assembly 124 is disposed in a manner described in detail as follows. In the embodiment, the guiding assembly 124 includes a first rack body 124a and a second rack body 124b. The first rack body 124a and the second rack body 124b are fixed in the chassis body 110. The first guiding slot G1 is formed on the first rack body 124a, and the second guiding slot G2 is formed on the second rack body 124b. The first guiding slot G1 has a first bottom end B1 and a first top end T1 opposite to each other, and the second guiding slot G2 has a second bottom end B2 and a second top end T2 opposite to each other. The first bottom end B1 is aligned to the second bottom end B2, and the first top end T1 is aligned to a juncture between first segment S1 and the second segment S2. A moving range of the first linking portion 122a is limited between the first bottom end B1 and the first top end T1, and a moving range of the second linking portion 122b is limited between the second bottom end B2 and the second top end T2.

When the frame 122 is accommodated in the chassis body 110 and is located at the first position P1 as illustrated in FIG. 1, the first linking portion 122a and the second linking portion 122b are respectively located at the first bottom end B1 of the first guiding slot G1 and the second bottom end B2 of the second guiding slot G2. When the frame 122 is moved upward and is located at the second position P2 as illustrated in FIG. 2A, the first linking portion 122a and the second linking portion 122b are respectively located at the first top end T1 of the first guiding slot G1 and the juncture between first segment S1 and the second segment S2 of the second guiding slot G2. When the frame 122 rotates upward and is located at the third position P3 as illustrated in FIG. 2B, the first linking portion 122a and the second linking portion 122b are respectively located at the first top end T1 of the first guiding slot G1 and the second top end T2 of the second guiding slot G2.

In addition, in the embodiment, a center of curvature of the second segment S2 is, for example, located at the first top end T1 of the first guiding slot G1. Thereby, as the second linking portion 122b is guided by the second segment S2, the frame 122 is thus able to rotate by taking the first linking portion 122a located at the first top end T1 as the rotation axis as described above. In other embodiments, the first guiding slot G1 and the second guiding slot G2 may be disposed in other suitable manners relative to each other, and the invention is not limited thereto.

Figure 3:
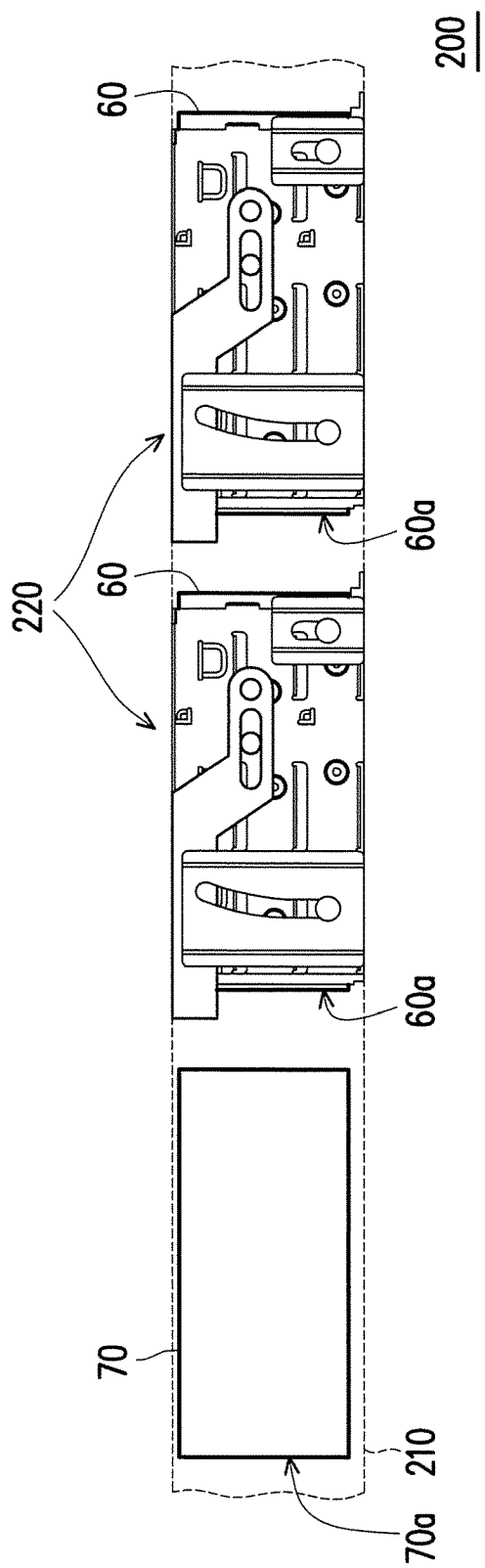
FIG. 3 is a side view of a chassis structure according to another embodiment of the invention.
Figure 4:
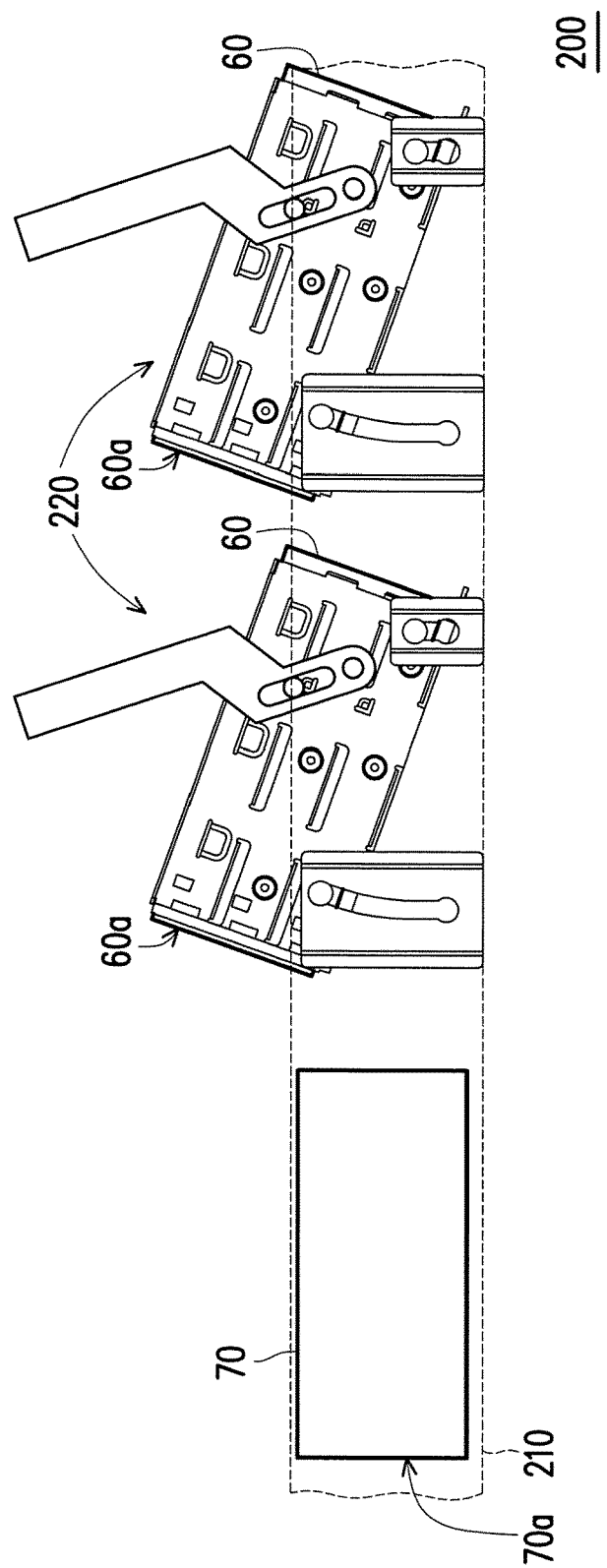
FIG. 4 illustrates operation of the holder module in FIG. 3.

The invention is not intended to limit the number of the holder module of the chassis structure. Examples are described in another embodiment as follows. FIG. 3 is a side view of a chassis structure according to another embodiment of the invention. FIG. 4 illustrates operation of the holder module in FIG. 3. In a chassis structure 200 illustrated in FIG. 3 and FIG. 4, a chassis body 210, each one of holder modules 220, and electronic modules 60 are disposed and operated in a manner similar to that of the chassis body 110, the holder module 120, and the electronic module 50 shown in FIG. 1, FIG. 2A, and FIG. 2B. Thus, details are not repeated hereinafter. Difference between the chassis structure 200 and the chassis structure 100 is that, the number of the holder modules 220 is plural (two are shown), and the holder modules 220 are disposed in sequence in the chassis body 210 in a horizontal direction, such that the electronic modules 60 respectively installed in the holder modules 220 are arranged in sequence in the horizontal direction.

Operation illustrated in FIG. 1, FIG. 2A, and FIG. 2B may be performed by the holder modules 220, such that end surfaces 60a of the electronic modules 60 are able to move upward and rotate, and then each of the end surfaces 60a is not blocked by the adjacent electronic module 60 or an adjacent electronic module 70 as illustrated in FIG. 4. Thus, the user may maintain the electronic modules 60 through the end surfaces 60a conveniently. Thereby, plural sliding tracks corresponding to the electronic modules 60 and the electronic module 70 are not required to be disposed. In the embodiment, as an end surface 70a of the electronic module 70 is not blocked by another electronic module, the holder module 220 corresponding to the electronic module 70 are not required to be disposed in the chassis body 210, but the invention is not limited thereto.

In view of the foregoing, in the chassis structure of the invention, the guiding assembly guides the frame to move upward and rotate relative to the chassis body by the first guiding slot and the second guiding slot thereof. As such, the end surface of the electronic module carried by the frame may be moved upward and rotate, and then the end surface is not blocked by the adjacent electronic module, so that a user may maintain the electronic module through the end surface conveniently. Accordingly, unlike conventional design, plural sliding tracks for adjacent electronic modules to be able to slide relatively and to be maintained conveniently are not required to be disposed, such that costs of installing the chassis structure may be reduced and arrangement space of the chassis structure may be saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A chassis structure, comprising:
a chassis body; and
at least one holder module, comprising:
a frame, located in the chassis body and having a first linking portion and a second linking portion, wherein the frame is adapted to carry an electronic module; and
a guiding assembly, disposed on the chassis body and having a first guiding slot and a second guiding slot, wherein the second guiding slot has a first segment and a second segment, the first guiding slot and the first segment extend along a straight direction, the second segment extends along an arched direction, the first linking portion is slidably disposed in the first guiding slot, the second linking portion is slidably disposed in the second guiding slot,
wherein the first linking portion and the second linking portion are adapted to move along the first guiding slot and the first segment respectively at the same time such that the frame moves upward from a first position to a second position, and then the second linking portion is adapted to move along the second segment such that the frame rotates to a third position by taking the first linking portion as a rotation axis.

2. The chassis structure as claimed in claim 1, wherein the first guiding slot has a first bottom end and a first top end opposite to each other, the second guiding slot has a second bottom end and a second top end opposite to each other, a moving range of the first linking portion is limited between the first bottom end and the first top end, and a moving range of the second linking portion is limited between the second bottom end and the second top end.

3. The chassis structure as claimed in claim 2, wherein the first bottom end is aligned to the second bottom end, and the first top end is aligned to a juncture between the first segment and the second segment.

4. The chassis structure as claimed in claim 2, wherein when the frame is located at the first position, the first linking portion and the second linking portion are respectively located at the first bottom end and the second bottom end.

5. The chassis structure as claimed in claim 2, wherein when the frame is located at the second position, the first linking portion and the second linking portion are respectively located at the first top end and the juncture between the first segment and the second segment.

6. The chassis structure as claimed in claim 2, wherein when the frame is located at the third position, the first linking portion and the second linking portion are respectively located at the first top end and the second top end.

7. The chassis structure as claimed in claim 2, wherein a center of curvature of the second segment is located at the first top end.

8. The chassis structure as claimed in claim 1, wherein the chassis body has a bottom surface, and an extending direction of the first guiding slot and the first segment is perpendicular to the bottom surface.

9. The chassis structure as claimed in claim 1, wherein the at least one holder module comprises a handle, the handle is pivoted to the chassis body and is connected to the frame, and the handle is adapted to rotate relative to the chassis body to drive the frame to move to the first position, the second position, and the third position.

10. The chassis structure as claimed in claim 9, wherein the handle has a slot, the frame has a connecting portion, and the connecting portion is slidably disposed in the slot.

11. The chassis structure as claimed in claim 1, wherein the guiding assembly comprises a first rack body and a second rack body, the first rack body and the second rack body are fixed to the chassis body, the first guiding slot is formed on the first rack body, and the second guiding slot is formed on the second rack body.

12. The chassis structure as claimed in claim 1, wherein the chassis structure is suitable for a server, and the electronic module is a hard disk module.

* * * * *